(12) United States Patent
Kumashiro (10) Patent No.: US 6,459,284 B1
(45) Date of Patent: Oct. 1, 2002

(54) DEVICE HAVING PERIODIC WIRING STRUCTURE AND TEST DEVICE THEREFOR

(75) Inventor: Hideo Kumashiro, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 49 days.

(21) Appl. No.: 09/665,906

(22) Filed: Sep. 20, 2000

(30) Foreign Application Priority Data

Dec. 7, 1999 (JP) ............................................. 11-347538

(51) Int. Cl.[7] ............................................. G01R 31/302
(52) U.S. Cl. ........................... 324/750; 324/529; 702/59
(58) Field of Search ................................. 324/529, 537, 324/750, 95, 522, 127, 758, 752, 226, 261, 263; 702/65, 59, 64; 395/916; 340/784; 350/333

(56) References Cited

U.S. PATENT DOCUMENTS 5,276,400 A * 1/1994 Denyer ........................ 324/750
6,107,806 A * 8/2000 Field .......................... 324/529
6,118,279 A * 9/2000 Field .......................... 324/529

FOREIGN PATENT DOCUMENTS

JP 6-75004 3/1994

* cited by examiner

*Primary Examiner*—Michael Sherry
*Assistant Examiner*—Trung Q. Nguyen
(74) *Attorney, Agent, or Firm*—Nixon & Vanderhye PC (57) ABSTRACT

A device having a periodic wiring structure and a test device therefore which can be fabricated at low cost and is capable of instantaneously determining whether the periodic wiring structure has been fabricated in a physically and electrically correct manner and whether particle obstacles are present. The bit lines of the device to be tested are simultaneously connected to a current source by a column decoder and a bit line connection circuit to generate magnetic force lines in a periodic distribution pattern from the currents flowing in all the bit lines. The generated magnetic force lines are sampled and detected by a one-dimensional Hall element array moved by an actuator. A spatial frequency spectrum of the periodic distribution pattern of the magnetic force lines detected by the one-dimensional Hall element array is by obtained and is collated with a spatial frequency spectrum of a reference distribution pattern.

7 Claims, 11 Drawing Sheets

DEVICE HAVING PERIODIC WIRING STRUCTURE AND TEST DEVICE THEREFOR

BACKGROUND OF THE INVENTION

The present invention relates to a device having a periodic wiring structure such as a semiconductor memory, CMOS image sensor, CCD sensor, liquid crystal panel or the like and a test device therefor.

Conventional test devices for a device having a periodic wiring structure for detecting formation failures due to particles (fine wastes) or the like in the process of fabricating a semiconductor device or liquid crystal panel include an optical-method test device using an optical sensor or the like to perform electronic image processing and an electrical-method test device, in which a current detecting tester is actually connected to a device to measure the currents flowing within the device and the obtained current values are used as judgement criteria. Also, apart from the aforementioned applications in the process of fabricating a semiconductor device or liquid crystal panel, there has been proposed a device for measuring currents flowing in the wiring pattern on a circuit board in which a magnetic force line sensor crossing the wiring pattern is disposed on a circuit board to detect magnetic force lines generated depending on the currents flowing in the wiring pattern so that the circuit is tested for normal operations (Japanese Patent Laid-Open Publication No. 6-5004)

Although the aforementioned optical-method test device can detect formation failures due to physical obstacles such as particles generated during a surface treatment process such as metal wiring or the like, there are problems in that it is extremely difficult to detect abnormalities within a device (for example, contact failure between wiring lines or the like) and a considerable amount of time is required for image processing resulting in a long measurement time.

On the other hand, the aforementioned electrical-method test device can electrically detect abnormalities within the device (contact failure or the like), but there is a problem in that a multiplicity of wiring lines need to be successively selected and measured resulting in a long measurement time. Also, physical foreign substances which are present between wiring lines cannot be detected as defects unless a short circuit exists. In some cases, the foreign substances are brought into contact with wiring lines after a test due to changes in their shape for some reason, thereby causing electrical failures. It is extremely difficult to detect such progressive failures.

Further, in the aforementioned device using the magnetic force line sensor to measure currents, the circuit must be fabricated in an electrically correct manner so as to generate correct magnetic force lines. Also, since the circuit must be formed in a correct physical shape so that the generated magnetic force lines correctly reach the sensor, the device has an advantage that physical and electrical fabrication abnormalities can be simultaneously observed. However, a multiplicity of magnetic force line sensors must be disposed in proportion to the large number of wiring lings in the device, such as bit lines, word lines and the like, in a semiconductor memory device. This causes the manufacturing cost to become very high. Also, a long test time is required to analyze the outputs from the multiplicity of sensors, which substantially increases the testing cost. Furthermore, only abnormal currents in portions where the sensors are disposed can be detected, which makes it difficult to respond to uncertain particle obstacles that can unpredictably occur anywhere in the device substrate.

SUMMARY OF THE INVENTION

Accordingly, an object of the present invention is to provide a device having a periodic wiring structure and a test device therefor at a low cost which can instantaneously perform an efficient judgment on whether the periodic wiring structure is fabricated in a physically and electrically correct manner and also respond to particle obstacles.

In order to achieve the above object, there is provided a device having a periodic wiring structure having a plurality of periodically disposed wiring lines, comprising magnetic force line generating means for simultaneously connecting at least a plurality of wiring lines out of all the periodically disposed wiring lines to a current source to generate magnetic force lines in a periodic distribution pattern from the currents flowing in the plurality of wiring lines connected to the current source.

According to the device having a periodic wiring structure with the constitution described above, which makes use of wiring lines (bit lines, word lines and the like) disposed at regular periods on a semiconductor memory, CMOS image sensor, CCD sensor, liquid crystal panel or the like, all the periodically disposed wiring lines or at least a plurality thereof are simultaneously connected to a current source by the magnetic force line generating means so that currents are allowed to flow in the plurality of wiring lines connected to the current source. Consequently, magnetic force lines in a periodic distribution pattern depending on the physical shape of the wiring lines are generated from the wiring lines connected to the current source. The state of a fabricated device can be observed in a simple and highly accurate manner by observing this periodic distribution pattern of the magnetic force lines. For example, simple means such as a sheet attached with periodically disposed magnetic powder bodies overlapped on the device or the like can be used to instantaneously judge whether the periodicity of the wiring lines is correctly maintained.

In one embodiment of the present invention, the current source has a constant current function for keeping the currents, each flowing in each wiring line, generally constant.

According to the device having a periodic wiring structure of the above embodiment, damage to wiring lines or deterioration of reliability due to overcurrent upon connection with the current source can be prevented because the current source keeps each current flowing in each wiring line generally constant.

Also, there is provided a test device for testing a device having a periodic wiring structure comprising:

magnetic force line detecting means for sampling and detecting at predetermined intervals magnetic force lines in a periodic distribution pattern generated from the device having the periodic wiring structure;

moving means for moving the magnetic force line detecting means along the surface of the device on which the wiring lines are provided; and pattern judging means for judging the periodic distribution pattern of the magnetic force lines detected by the magnetic force line detecting means.

According to the above test device for a device having a periodic wiring structure, in the device having a periodic wiring structure, at least a plurality of wiring lines of all the periodically disposed wiring lines are simultaneously connected to the current source by the magnetic force line generating means to generate magnetic force lines in a periodic distribution pattern by the currents flowing in the plurality of wiring lines connected to the current source. Then, the magnetic force lines having a periodic distribution pattern generated from the device having a periodic wiring structure are sampled and detected at predetermined intervals by the magnetic force line detecting means, which is moved by the moving means (actuator or the like) along the device surface. At this time, the period of the magnetic force line distribution pattern is made closer to the sampling interval so that a moire pattern (interference fringes) is generated by the interference between the period of the magnetic force line distribution pattern and the sampling period. By judging this moire pattern, whether the periodic wiring structure is fabricated in a physically and electrically correct manner can be efficiently determined in an instant. Also, irregularities in the distribution pattern of magnetic force lines depending on the physical shape of the wiring lines due to particle obstacles can be detected.

In one embodiment of the test device according to the present invention, the pattern judging means obtains a spatial frequency spectrum of the periodic distribution pattern of the magnetic force lines detected by the magnetic force line detecting means by Fourier transform and collates an obtained frequency spectrum with a spatial frequency spectrum of a reference distribution pattern.

According to the test device for a device having a periodic wiring structure of the above embodiment, the pattern judging means obtains a spatial frequency spectrum of the periodic distribution pattern of magnetic force lines detected by the magnetic force line detecting means by Fourier transform and collates the obtained spatial frequency spectrum with the reference spatial frequency spectrum of the distribution pattern of a conforming product. Thus, since the spatial frequency spectrum of a device to be measured can be instantaneously compared with the spatial frequency spectrum of a conforming product, whether the product is defective or not can be judged at a high speed.

In one embodiment of the test device, the magnetic force line detecting means is a one-dimensional magnetic force line detecting element array in which a plurality of magnetic force line detecting elements for detecting magnetic force lines generated from the device are arranged in one line; and the moving means moves the one-dimensional magnetic force line detecting element array in the direction perpendicular to the direction of the array of the magnetic force line detecting elements along the surface of the device on which the wiring lines are provided.

According to the test device for a device having a periodic wiring structure of the above embodiment, the moving means moves the one-dimensional magnetic force line detecting element array in which a plurality of elements for detecting magnetic force lines generated from the device are arranged in one line in the direction perpendicular to the direction of the arrangement of the magnetic force line detecting elements along the surface of the device on which the wiring lines are provided to scan a two-dimensional space, which is the surface of the device to be measured. Thus, since the magnetic force lines can be sampled in a batch in the one-dimensional direction, which is the direction of the arrangement of the plurality of magnetic force line detecting elements, the magnetic force lines can be measured at a higher speed and a lower cost.

Also, there is provided a test device for testing a device having a periodic wiring structure comprising:

a two-dimensional magnetic force line detecting element array in which a plurality of magnetic force line detecting elements for detecting magnetic force lines in a periodic distribution pattern generated from the device having the periodic wiring structure; and pattern judging means for judging the periodic distribution pattern of magnetic force lines detected by the two-dimensional magnetic force line detecting element array.

According to the above test device for a device having a periodic wiring structure, in the device having a periodic wiring structure, at least a plurality of wiring lines of all the periodically disposed wiring lines are simultaneously connected to a current source by the magnetic force line generating means to generate magnetic force lines in a periodic distribution pattern by the currents flowing in the plurality of wiring lines connected to the current source. Then, the magnetic force lines having a periodic distribution pattern generated from the device having a periodic wiring structure are sampled and detected by the two-dimensional magnetic force line detecting element array. At this time, the period of the magnetic force line distribution pattern is made closer to the sampling interval so that a moire pattern (interference fringes) is generated by the interference between the period of the magnetic force line distribution pattern and the sampling period. By judging this moire pattern, whether the periodic wiring structure is fabricated in a physically and electrically correct manner can be efficiently determined in an instant. Also, irregularities in the distribution pattern of magnetic force lines depending on the physical shape of the wiring lines due to particle obstacles can be detected. Further, since the magnetic force lines are sampled and detected in a batch in a two-dimensional space, which is the surface of the device to be measured by the two-dimensional magnetic force line detecting element array, no actuator or the like for moving the magnetic force line detecting elements or magnetic force line detecting element array is required, and thereby a higher-speed test device can be provided.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The device having a periodic wiring structure and the test device therefor of the present invention will be described in detail below with reference to the embodiments shown in the drawings.

Figure 1:
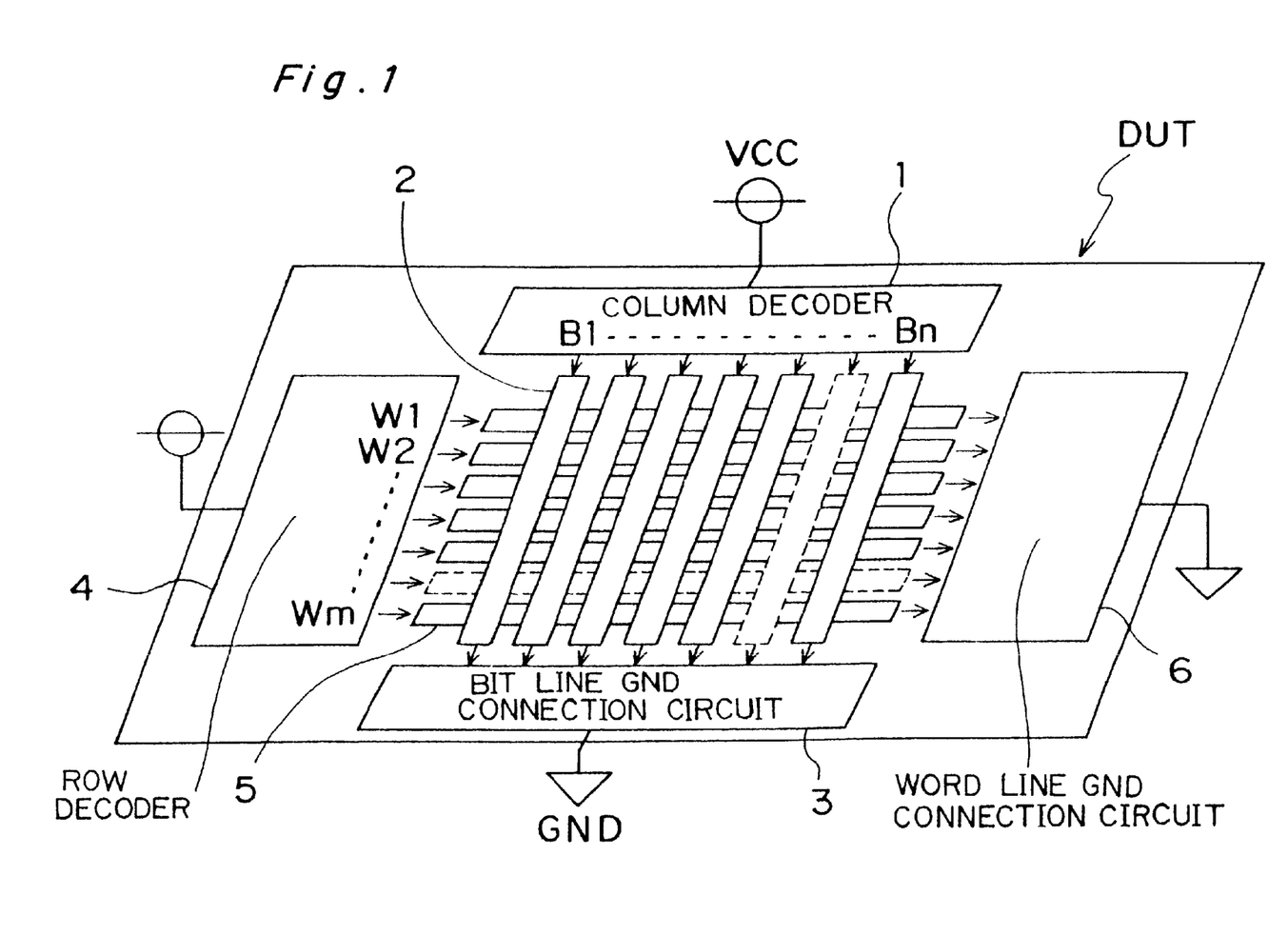
FIG. 1 is a schematic constitution view showing a device having a periodic wiring structure according to an embodiment of the invention.

FIG. 1 is a schematic constitution view showing a semiconductor memory as a device having a periodic wiring structure according to an embodiment of the present invention. Hereafter, this semiconductor memory is referred to as a device to be measured DUT.

The device to be measured DUT has a Group of memory cells arrayed in a lattice (not shown in the figure), a column decoder 1 for selecting a column of the memory cells, a plurality of bit lines 2, which are metal wiring lines of which one ends are connected to the column decoder 1, a bit line GND connection circuit 3 connected to the other ends of the bit lines 2, a row decoder 4 for selecting a row of the memory cells, a plurality of word lines 5, which are metal wiring lines connected to one end of the row decoder 4 and a word line GND connection circuit 6 connected to the other ends of word lines 5. A power supply VCC connected to the column decoder 1 is connected to all the bit lines 2 via the column decoder 1 to activate all the bit lines 2. A power supply VCC connected to the row decoder 4 is connected to all the word lines 5 via the row decoder 4 to activate all the word lines 5.

The bit line GND connection circuit 3 has a current-controlling circuit as a current source in order to prevent the deterioration of reliability due to melting of wiring lines caused by overload, electromigration (disconnection or short circuit of wiring lines due to damage by electron flows) or the like when current flows in a plurality of bit lines 2 simultaneously. The word line GND connection circuit 6 also has a current-controlling circuit as a current source in order to prevent the deterioration of reliability due to melting of wiring lines caused by overload, electromigration or the like when currents flow in a plurality of bit lines 2 simultaneously. It is noted that, in the device to be measured DUT of the above constitution, the current-controlling circuit in the bit line GND connection circuit 3 and the word line GND connection circuit 6 may be provided in an external power supply (not shown in the figure) on the power supply VCC side.

It is noted that the column decoder 1, bit lines 2 and bit line GND connection circuit 3 constitute one magnetic force line generating means while the row decoder 4, word lines 5 and word line GND connection circuit 6 constitute another magnetic force line generating means.

Figure 2A:
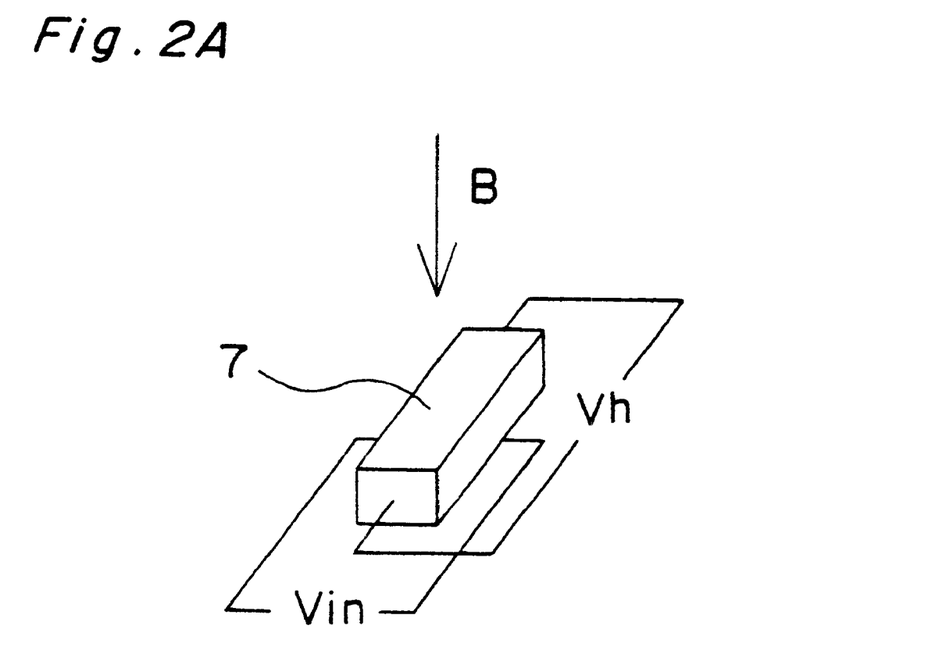
FIGS. 2A and 2B are a view showing a Hall element as a magnetic force line detecting element and a view showing the characteristics of the Hall element, respectively.
Figure 2B:
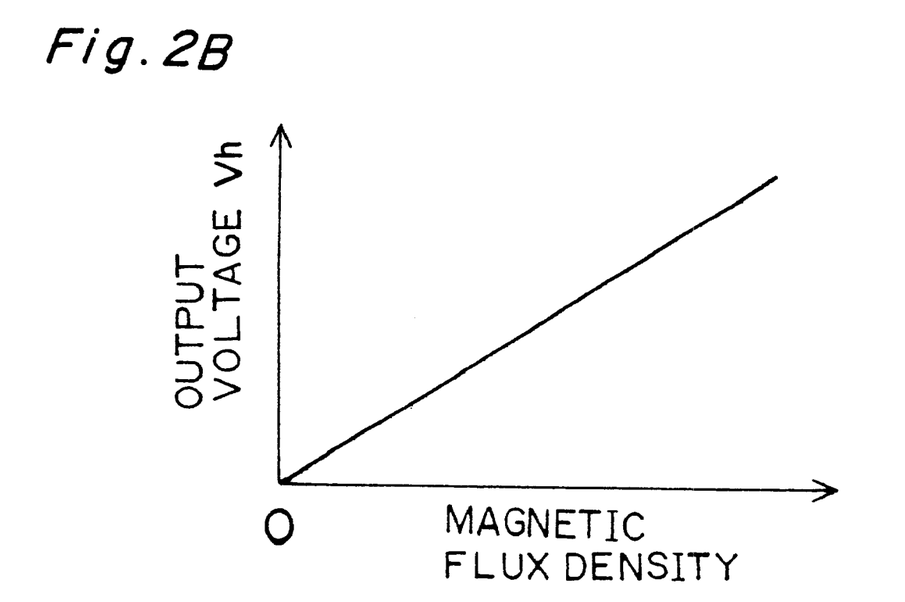

FIG. 2A shows the constitution of a Hall element 7 as a semiconductor element for detecting magnetic force lines. As shown in FIG. 2B, the Hall element 7 has an output voltage Vh which changes in proportion to the magnetic flux density of magnetic force lines B. A voltage output type Hall element 7 is shown in this embodiment, but a current output type Hall element may be used.

Figure 3:
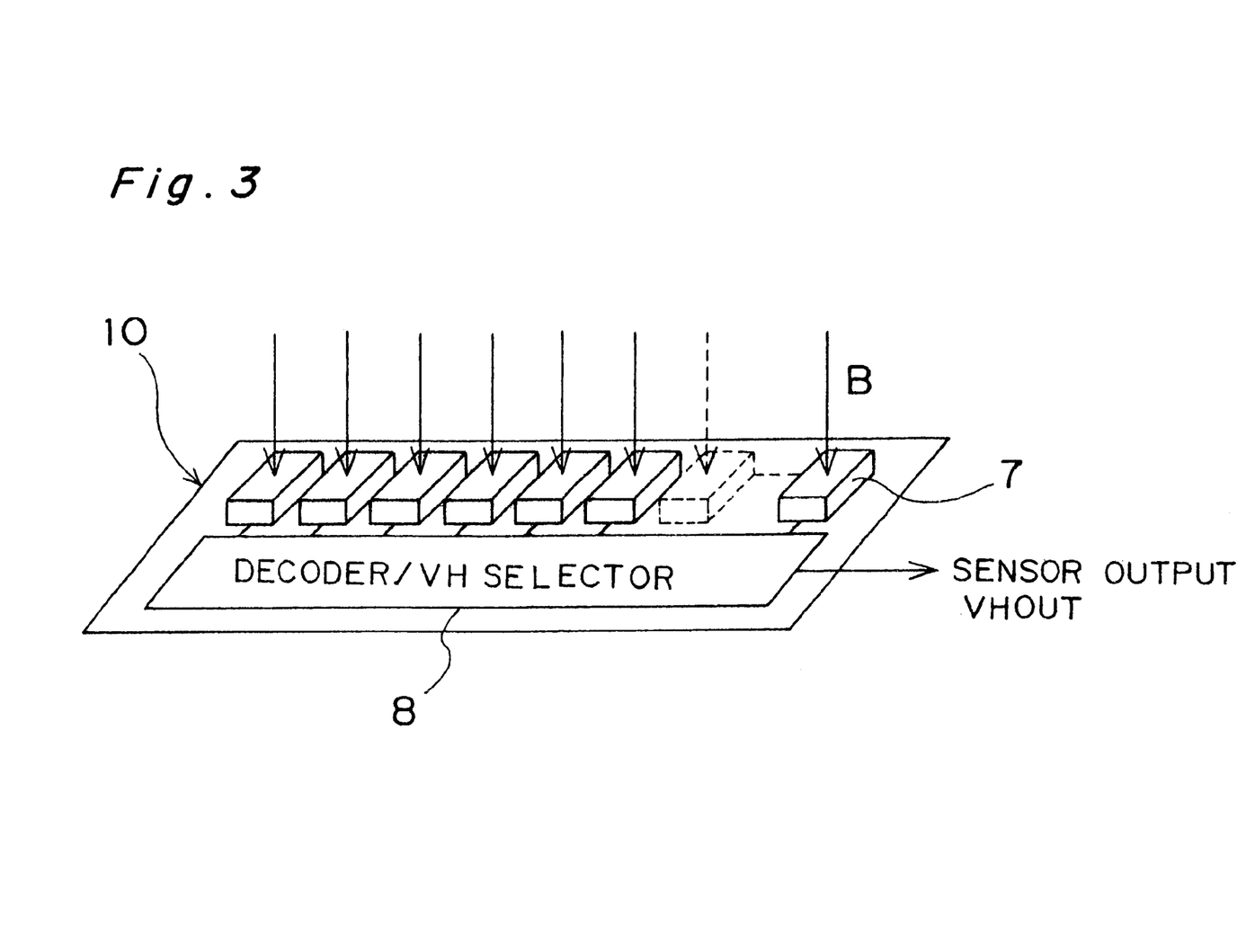
FIG. 3 is a schematic constitution view showing the constitution of a one-dimensional Hall element array in which a plurality of Hall elements are arranged in a line.

FIG. 3 shows the constitution of a one-dimensional Hall element array 10 as magnetic force lines detecting means in which a plurality of Hall elements 7 are arrayed in one line (in a one-dimensional direction). The one-dimensional Hall element array 10 has a decoder/VH selector 8 for selecting a sensor output VHout of each Hall element 7. FIG. 3 shows a Hall element array 10 in a one-dimensional constitution, but it is needless to say that a two-dimensional Hall element array can be constituted by integrating a plurality of similar one-dimensional Hall element arrays 10 in the perpendicular direction.

Figure 4:
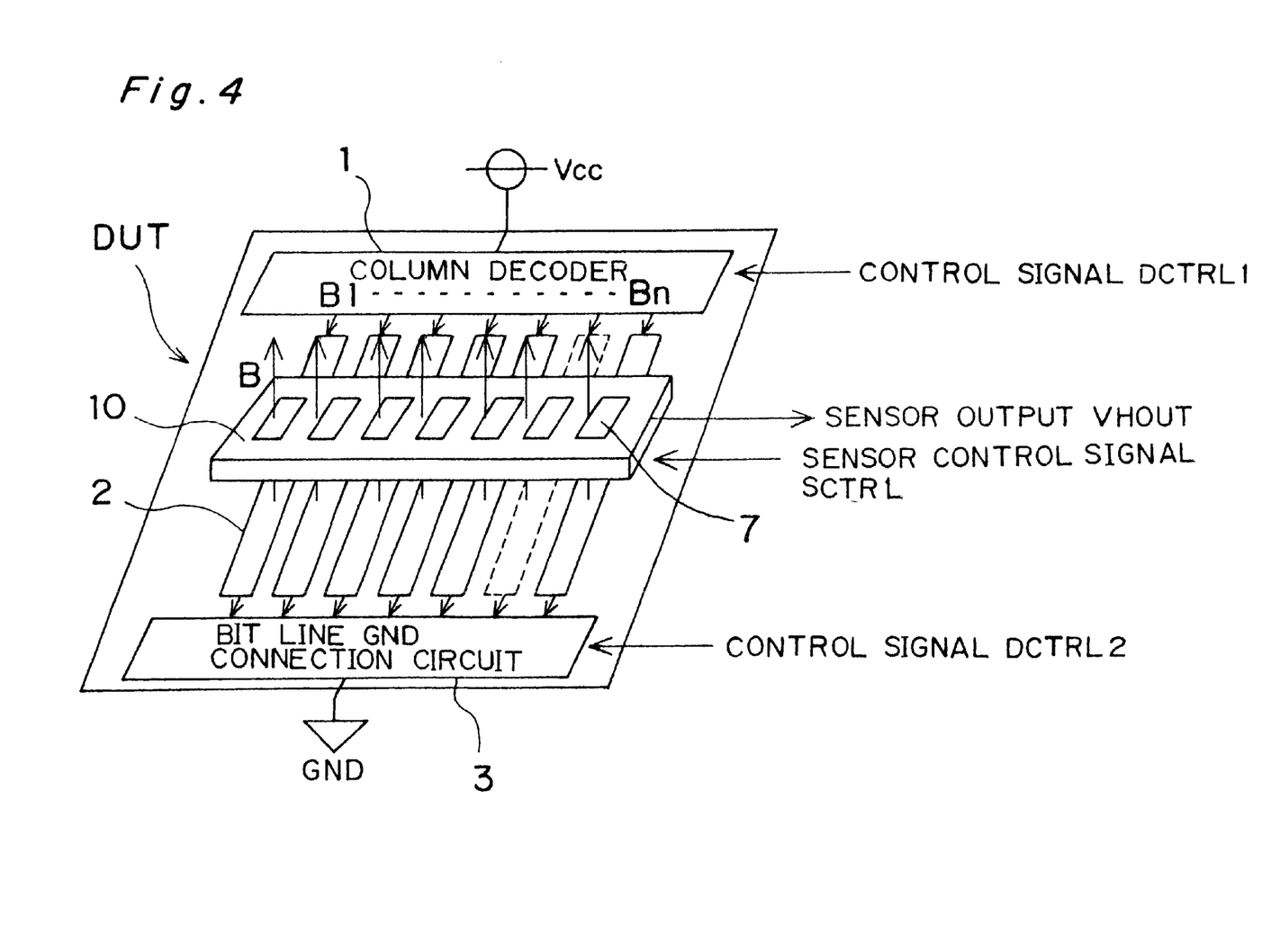
FIG. 4 is a view showing how magnetic force lines generated from the device to be measured are detected by using the one-dimensional Hall element array.

FIG. 4 shows how the one-dimensional Hall element array 10 is used to detect magnetic force lines generated from the device to be measured DUT. It is noted that FIG. 4 shows only detection in the column direction to make the figure simple for an easy explanation.

In order to start a test, a control signal Dctrl1 is first made active so that all bit lines 2 are connected to a power supply VCC to activate all bit lines 2 for a column decoder 1. Further, a control signal Dctrl2 is made active to connect the bit lines 2 to the ground GND via a bit line GND connection circuit 3 having a current-controlling circuit. Consequently, a current path is opened from the power supply VCC to the ground GND via each bit line 2, from which magnetic force lines B are generated depending on the current flow. Then, the magnetic force lines B generated from each bit line 2 are detected by the one-dimensional Hall element array 10.

At this time, the period for sampling the magnetic force lines is determined by sensor control signals Sctrl1 and the intervals between Hall elements 7 in the one-dimensional Hall element array 10. It is noted that the sampling period is preferably set extremely close to the fundamental period of an object to be measured. If the sampling period is too short in comparison with the fundamental period of the object to be measured, no moire fringes are generated and thereby measurement cannot be performed. If the sampling period is too long, irregularities in the period of the object to be measured cannot be detected. The sensor output VHout of the one-dimensional Hall element array 10 is sent to a pattern judging device (see FIG. 6) at a transfer timing by the sensor control signals Sctrl. The one-dimensional. Hall element array 10 is driven by an actuator (not shown in the figure) in the direction parallel to the bit lines 2 and can scan a two-dimensional space, which is the surface of the device to be measured DUT.

Figure 5:
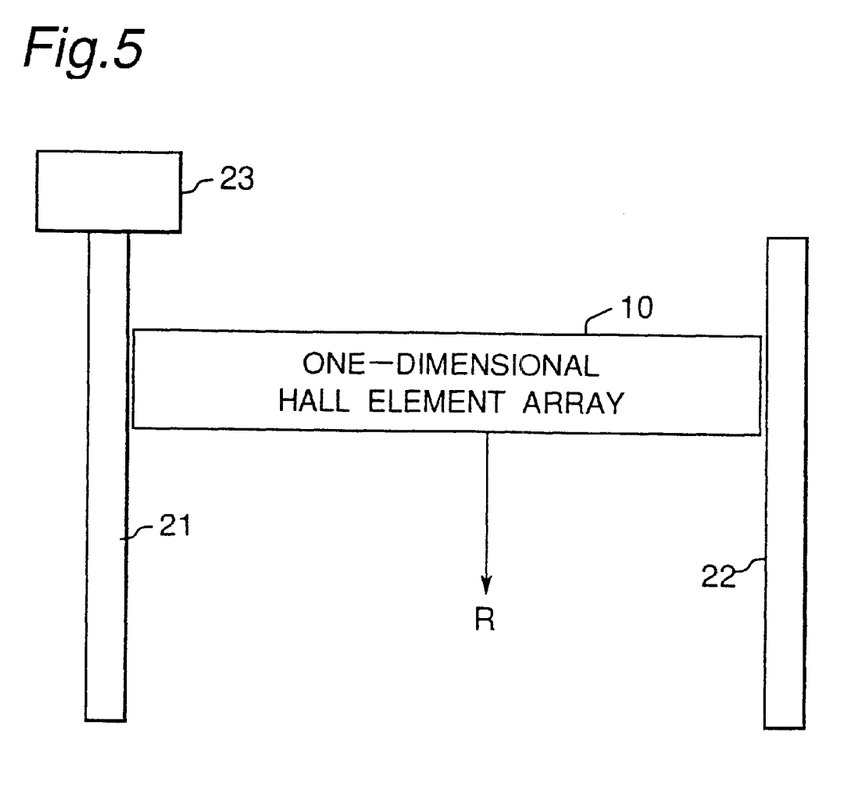
FIG. 5 is a schematic view showing the one-dimensional Hall element array and an actuator for driving it.

FIG. 5 is a schematic view showing an actuator as moving means for driving the one-dimensional Hall element array 10. Reference numerals 21 and 22 denote guide rails for guiding both ends of the one-dimensional Hall element array 10. Reference numeral 23 denotes a stepping motor for driving the one-dimensional Hall element array 10 in the direction of the arrow R. When the one-dimensional Hall element array 10 finishes the measurement in the direction of the array of Hall elements 7, it is moved by the stepping motor 23 in the arrow R direction and performs the next measurement in the direction of the array of the Hall elements 7 of one-dimensional Hall element array 10.

Figure 6:
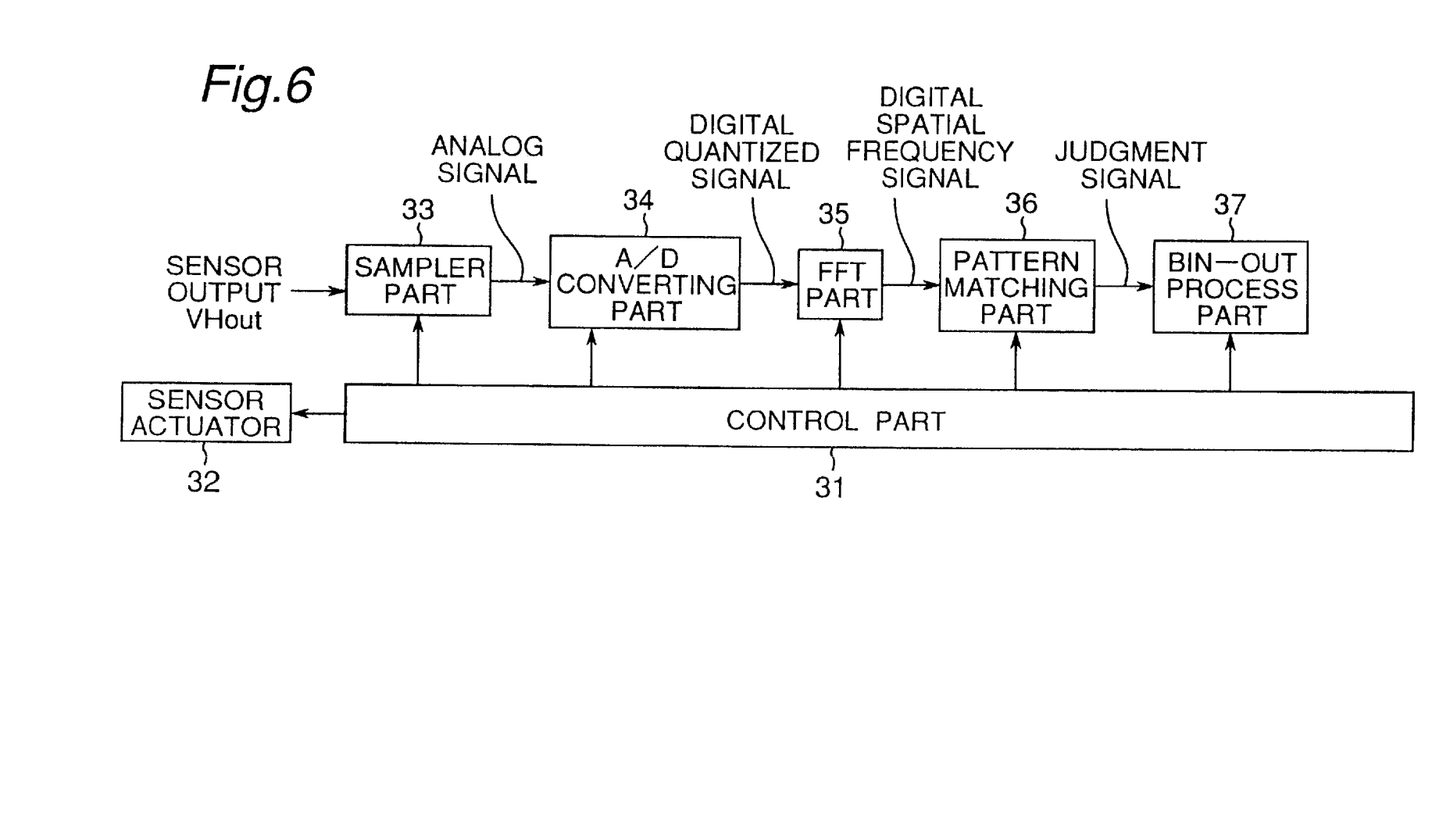
FIG. 6 is a schematic block view showing a pattern judging device in the test device for a device having a periodic wiring structure.

FIG. 6 is a block view showing a pattern judging device as pattern judging means which has a control part 31, sensor actuator 32, sampler part 33, A/D (analog/digital) converting part 34, FFT (fast Fourier transform) part 35, pattern matching part 36 and bin-out process part 37. The sensor actuator 32, sampler part 33, A/D converting part 34, FFT part 35, pattern matching part 36 and bin-out process part 37 are controlled by control signals from the control part 31. This pattern judging device together with the one-dimensional Hall element array 10, guide rails 21, 22, and stepping motor 23 shown in FIG. 5 constitutes the test device for a device having a periodic wiring structure.

The sensor output VHout outputted from the one-dimensional Hall element array 10 is converted to digital quantized signals by the A/D converting part 34 and further converted to digital spatial frequency signals by the FFT part 35. Subsequently, the digital spatial frequency signals are collated with the reference data by the pattern matching part 36 to instantaneously measure a generated moire pattern, by which the state of the fabricated device to be measured DUT is judged so that the bin-out process part 37 sorts conforming products and defective products. The actuator shown in FIG. 5 may be used to drive a 0-dimensional sensor. Also, the sampler part 33 is used to determine the sampling period of the 0-dimensional sensor.

Figure 7:
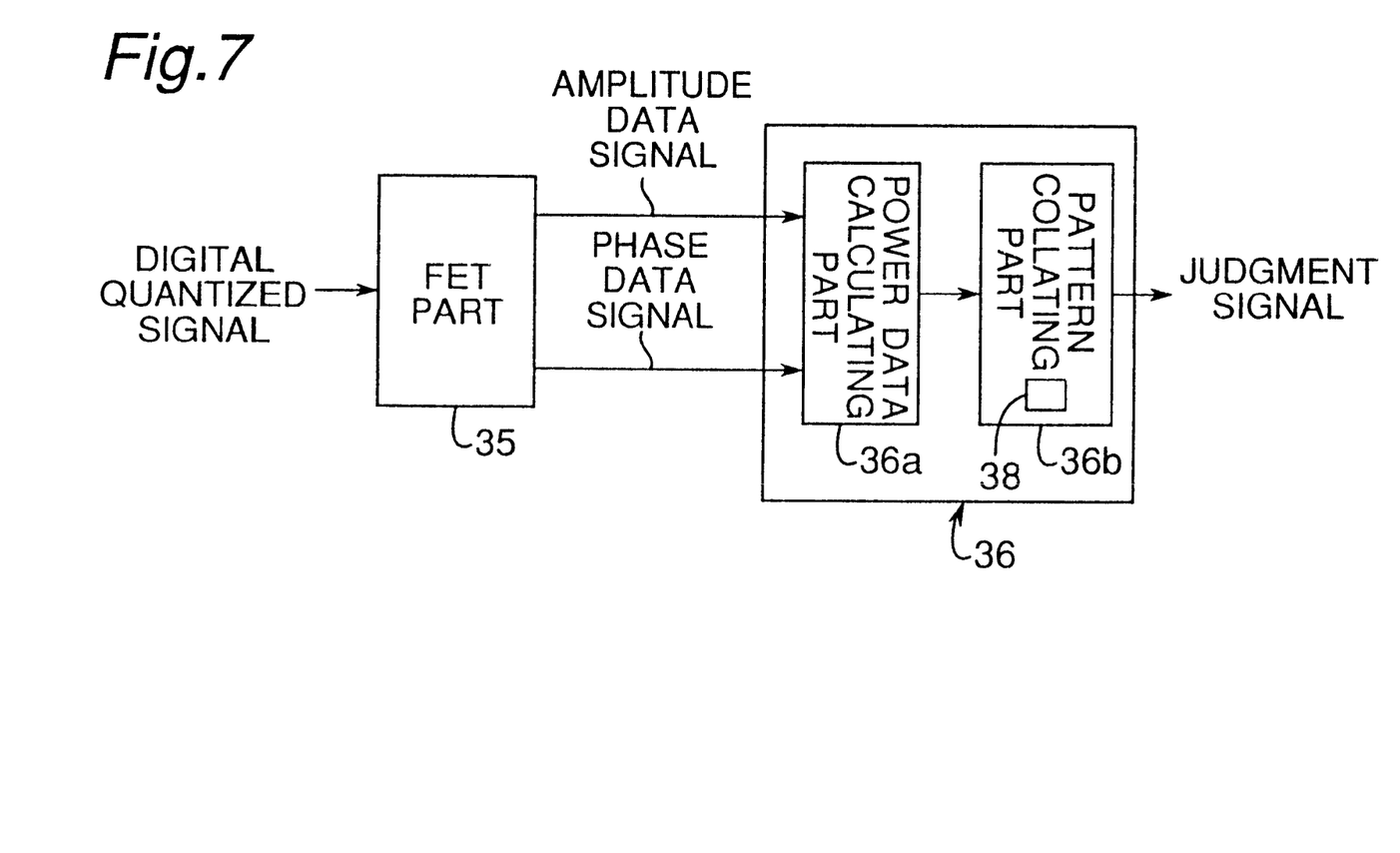
FIG. 7 is a view showing the constitution of a pattern matching part of the pattern judging device.

FIG. 7 shows the constitution of the pattern matching part 36, which has a power data calculating part 36a and a pattern collating part 36b. For digital quantized signals output from the A/D converting part 35 (see FIG. 6), amplitude data signals and phase data signals representing a spatial frequency spectrum are generated by using the FFT part 35. Further, frequency power data is calculated based on these signals by the power data calculating part 36a. Subsequently, this calculated frequency power data is input to the pattern collating part 36b, which then makes a final judgement (pass/fail) from the frequency power data (power intensity distribution for the frequency) and the reference frequency power data stored in the reference table 38 (reference data).

Figure 8A:
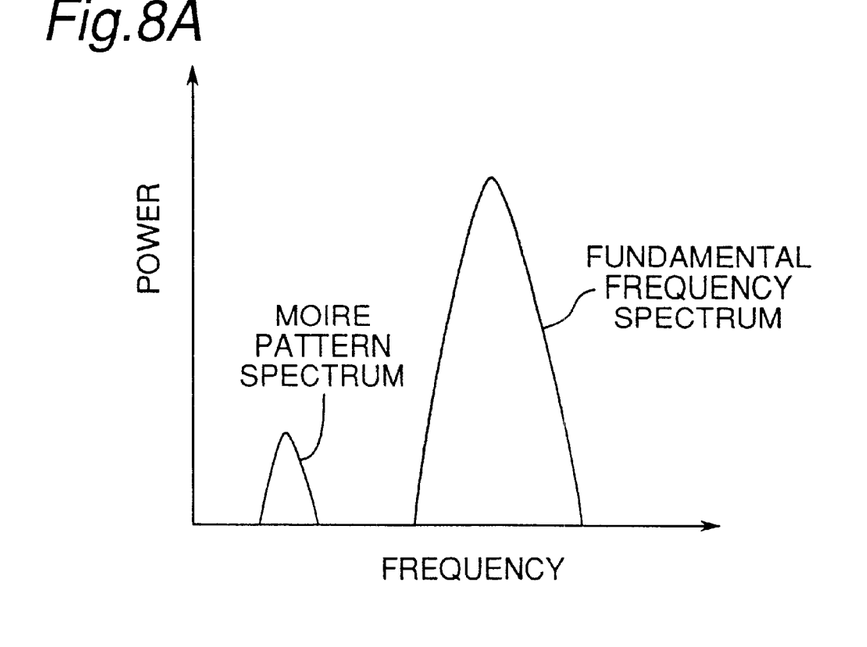
FIGS. 8A and 8B are a view showing an example of a conforming product pattern in the pattern matching part and a view showing an example of a defective product pattern, respectively.
Figure 8B:
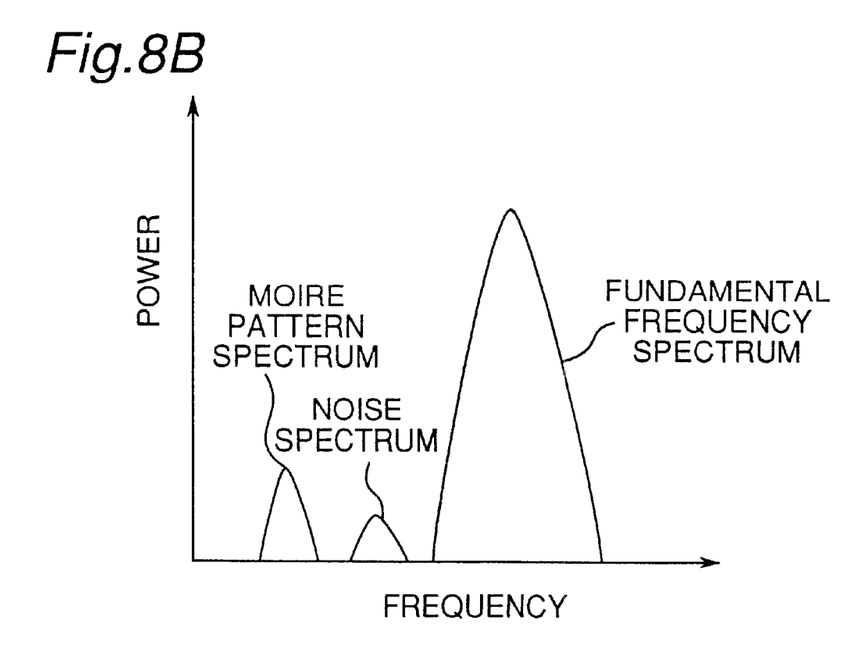

For example, FIGS. 8A and 8B show a conforming product pattern and a defective product pattern, respectively, in the pattern matching part 36. Since all bit lines are correctly formed in the conforming product pattern shown in FIG. 8A, the fundamental frequency spectrum generated from the bit line period and the sampling period and the moire period spectrum generated from a small lag between the bit line period and the sampling period are stably generated. On the other hand, since part of the bit lines are defective in the defective product pattern shown in FIG. 8B, the fundamental frequency spectrum generated from the bit line period and the sampling period, the moire period spectrum generated from a small lag between the bit line period and the sampling period and a third noise spectrum generated by the defects are generated. By comparing FIGS. 8A and 8B, a frequency spectrum other than the fundamental frequency spectrum and the moire period spectrum (third noise spectrum) is extracted. If this frequency spectrum exceeds the predetermined reference value (value required for not picking up the background noise), the device to be measured DUT is judged as a defective product.

Figure 9:
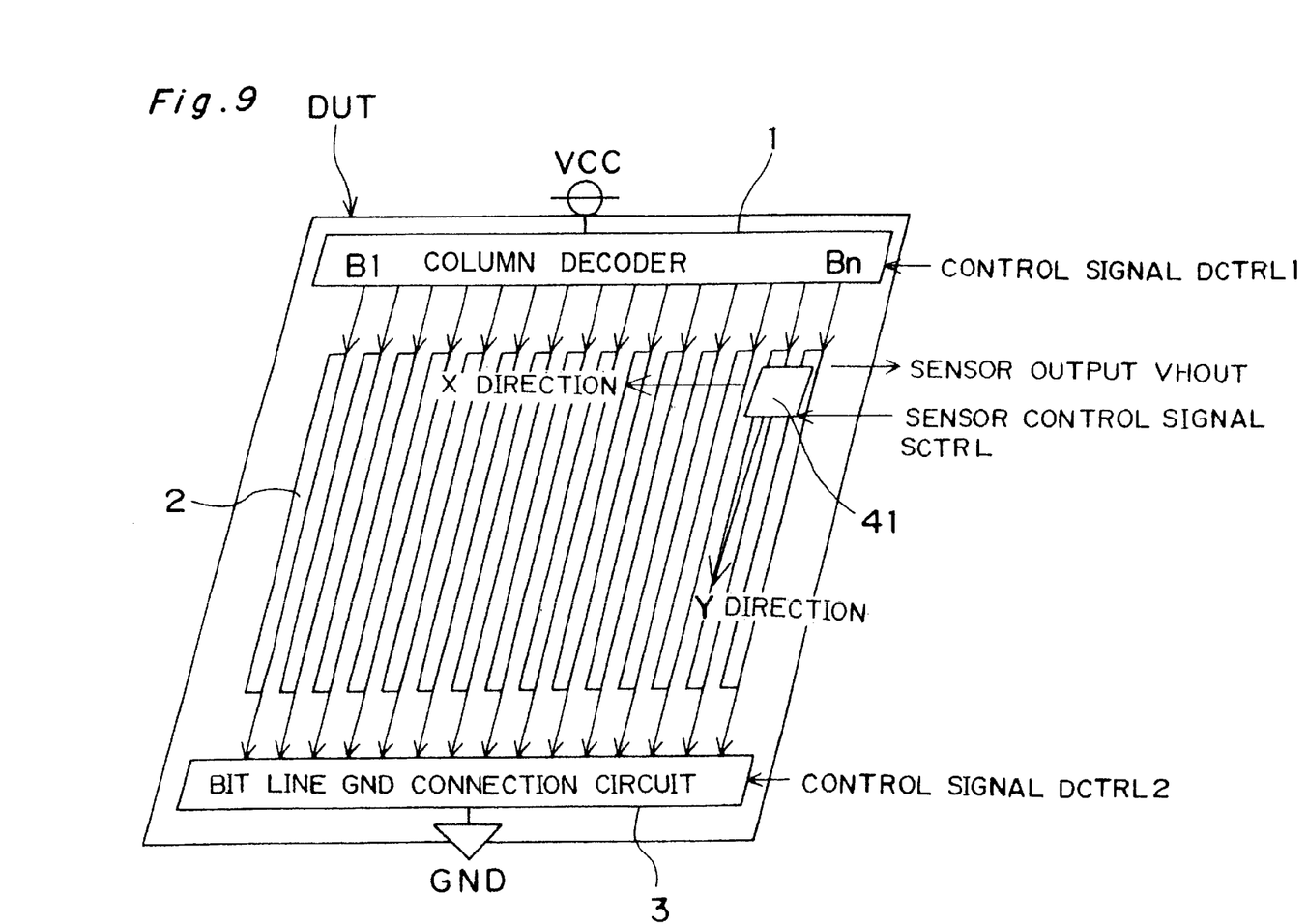
FIG. 9 is a view showing the case where the surface of the device to be measured is scanned by using a 0-dimensional Hall element.

FIG. 9 shows the case where magnetic force lines generated in a device to be measured DUT are detected by using a 0-dimensional (point) Hall element 41. it is noted that FIG. 9 shows only the column direction to make the figure simple for a simple description.

A control signal Dctrl1 is made active to connect the power supply VCC to one ends of all bit lines 2 via a column decoder 1 so that all the bit lines are activated. The other ends of all the bit lines are connected to the ground GND via a bit line GND connection circuit 3 to create a current path from the power supply VCC to the ground GND via each bit line 2. Consequently, magnetic force lines depending on the current flow are generated from each bit line 2. These magnetic force lines are detected by the 0-dimensional Hall element 41. The sampling period of the magnetic force lines is determined by sensor control signals Sctrl and the unit distance moved by the actuator in the X direction (not shown in the figure). The sensor output VHout of the 0-dimensional Hall element 41 is sent to the pattern judging device (see FIG. 6) at a transfer timing by the sensor control signals Sctrl. The 0-dimensional Hall element 41 is further driven in the Y direction by the actuator and can scan the surface of the device to be measured DUT.

Similarly, a current path is also created for the word lines and the surface of the device to be measured DUT is scanned to judge whether word lines (not shown in the figure) are defective or not.

Figure 10:
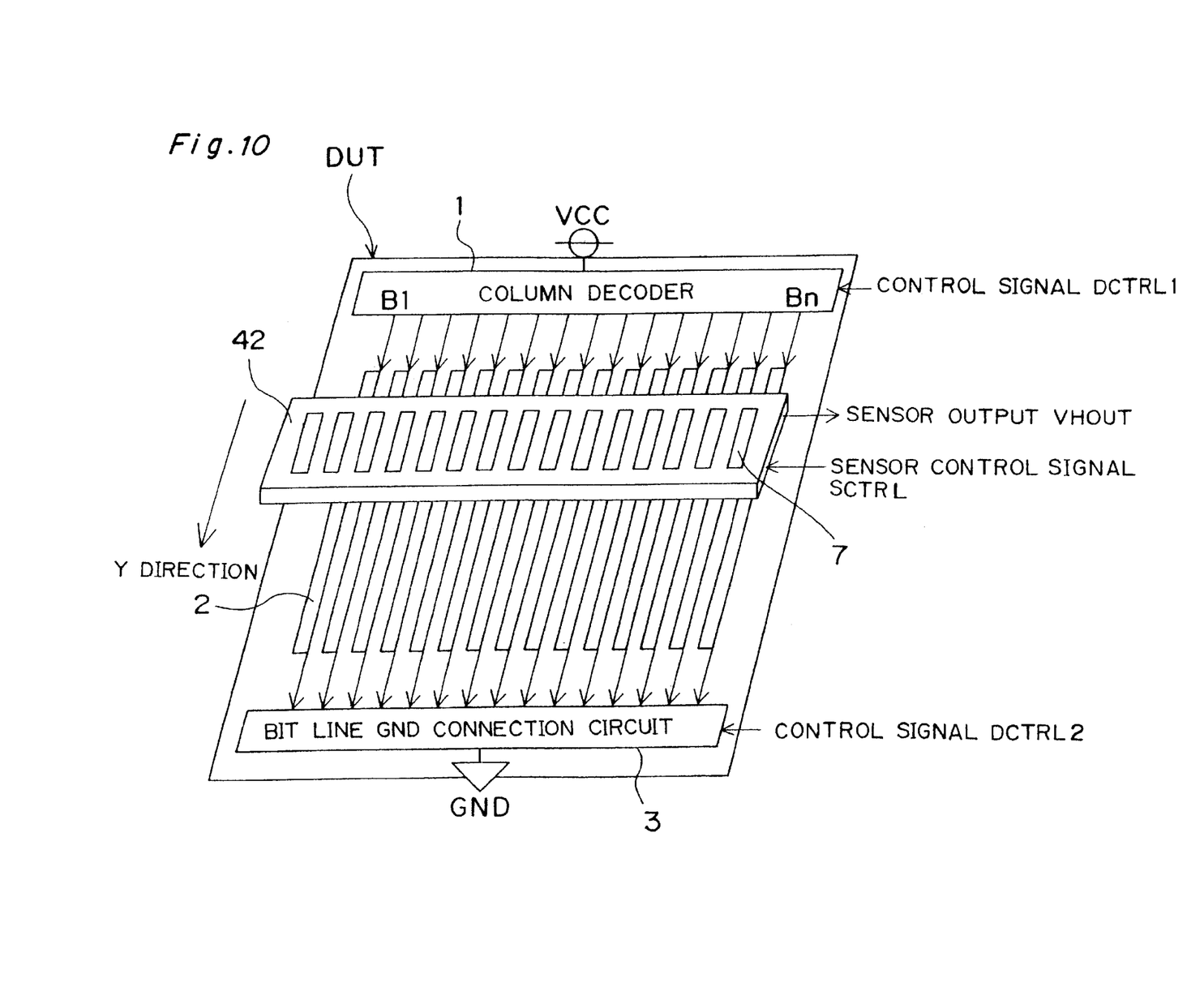
FIG. 10 is a view showing the case where magnetic force lines generated in the device to be measured are detected by using a one-dimensional Hall element array.

FIG. 10 shows the case where magnetic force lines generated in the device to be measured DUT are detected by using a one-dimensional Hall element array 42 as a one-dimensional magnetic force line detecting element array, which is a magnetic force lines detecting means. A plurality of Hall elements 7 are arranged in a line in this one-dimensional Hall element array 42. It is noted that FIG. 10 shows only detection in the column direction to make the figure simple for a simple description and the explanation on the operation is omitted because the operation is the same as that of the one-dimensional Hall element array 10 shown in FIG. 4. The one-dimensional Hall element array 42 does not need to cover the whole area in the X direction and may be disposed to cover a half of the area in the X direction so that two scannings in the X direction are separately performed. Similarly, a current path is also created and the surface of the device to be measured DUT is scanned by the one-dimensional Hall element array 42 to judge whether word lines (not shown in the figure) are defective or not.

Figure 11:
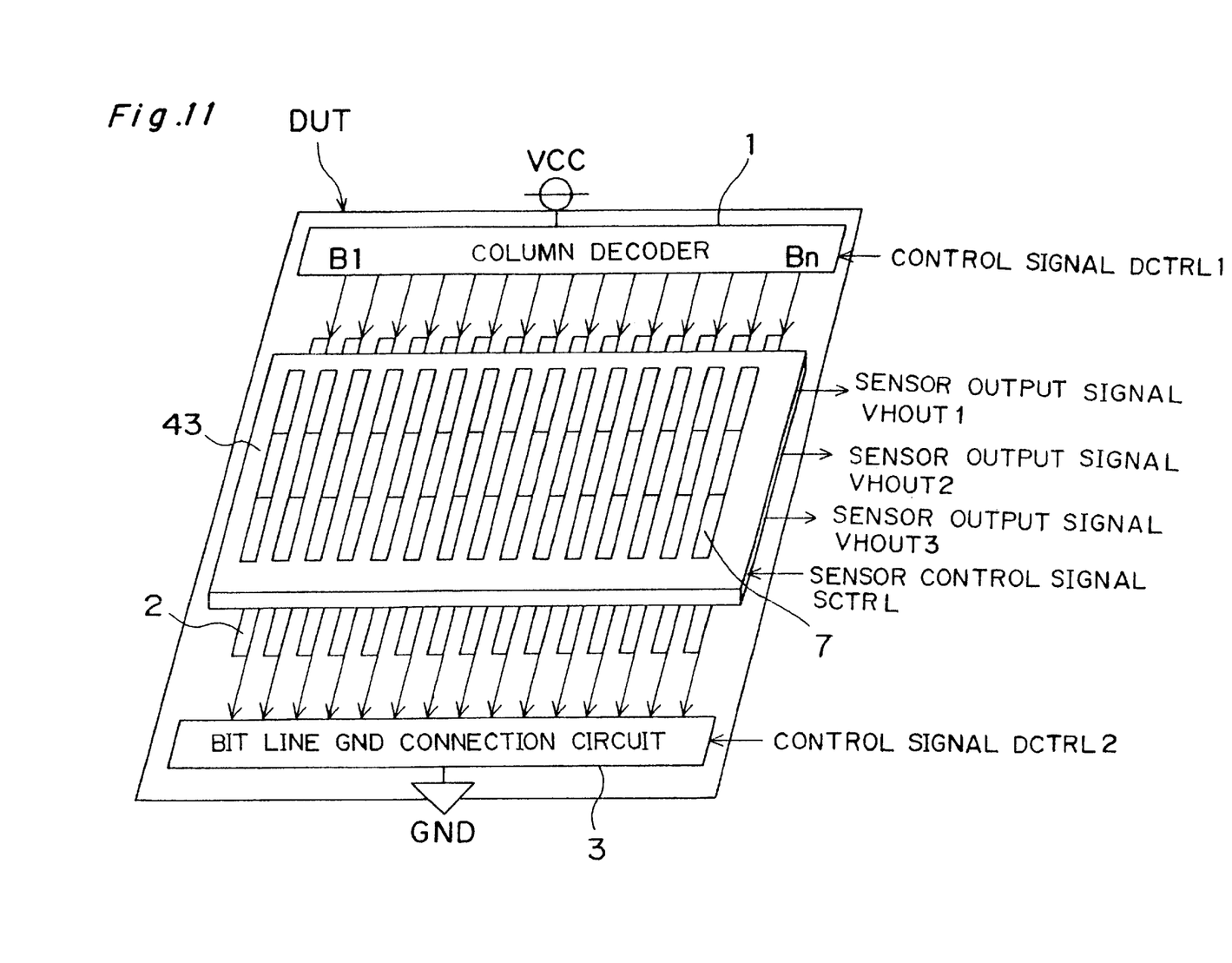
FIG. 11 is a view showing the case where magnetic force lines generated in the device to be measured are detected by using a two-dimensional Hall element array.

FIG. 11 shows the case where magnetic force lines generated in the device to be measured DUT are detected by using a two-dimensional Hall element array 43 as a two-dimensional magnetic force line detecting element array, which is magnetic force line detecting means. A plurality of Hall elements 7 are arrayed in a lattice in this two-dimensional Hall element array 43. It is noted that FIG. 11 shows only detection in the column direction to make the figure simple for a simple description.

A control signal Dctrl1 is made active to connect the power supply VCC to one ends of all bit lines 2 via a column decoder 1 so that all the bit lines 2 are activated. The other ends of all the bit lines are 2 are connected to the ground GND via a bit line GND connection circuit 3 to create a current path from the power supply VCC to the ground GND via each bit line 2. Consequently, magnetic force lines depending on the current flow are generated from each bit line 2. These magnetic force lines are detected by the two-dimensional Hall element array 43. The sampling period of the magnetic force lines is determined by sensor control signals Sctrl and the Hall element intervals of the two-dimensional Hall element array 43. The sensor outputs VHout1–VHout3 of the two-dimensional Hall element array 43 are sent to the pattern judging device (see FIG. 6) at a transfer timing by the sensor control signals Sctrl.

Similarly, a current path is also created in all word lines and magnetic force lines are detected by the two-dimensional Hall element array 43 to judge whether word lines (not shown in the figure) are defective or not.

It is noted that the two-dimensional Hall element array 43 does not need to cover the whole area to be measured and may be disposed to cover, for example, a quarter of the area so that four scannings are separately performed.

Thus, in the device to be measured DUT as a device having a periodic wiring structure, the periodic distribution pattern of magnetic force lines from the device to be measured DUT is observed so that the state of the fabricated device, that is, whether the correct periodicity is maintained in the fabricated wirings can be instantaneously judged in a simple and highly accurate manner.

Also, since the current-controlling circuits in the bit line GND connection circuit 3 and word line GND connection circuit 6 keep the currents flowing in each bit line 2 and each word line 5 constant, problems such as damage to a bit line 2 or word line 5 due to overcurrent and the like can be prevented.

Also, magnetic force lines in a periodic distribution pattern generated from the device to be measured DUT are sampled and detected at predetermined intervals by the 0-dimensional Hall element 41, one-dimensional Hall element array 42 (10) or two-dimensional Hall element array 43 so that a moire pattern (interference fringes) is generated by interference between the period of the magnetic force line distribution pattern and the sampling period. By judging this moire pattern, whether the periodic wiring structure is fabricated in a physically and electrically correct manner can be efficiently determined in an instant. Also, irregularities in the distribution pattern of magnetic force lines depending on the physical shape of the wiring lines due to particle obstacles can be detected.

Also, the pattern judging means obtains a spatial frequency spectrum of the periodic magnetic force line distribution pattern detected by the 0-dimensional Hall element 41, one-dimensional Hall element array 42 (10) or two-dimensional Hall element array 43 by Fourier transform and collates the obtained spatial frequency spectrum with the reference spatial frequency spectrum of the distribution pattern of a conforming product. Thus, since the spatial frequency spectrum of the device to be measured can be instantaneously compared with the spatial frequency spectrum of a conforming product, whether the product is defective or not can be judged at a high speed.

Also, as shown in FIG. 10, the one-dimensional Hall element array 42 in which a plurality of Hall elements 7 for detecting magnetic force lines generated from the device to be measured DUT are arranged in a line is moved in the direction perpendicular to the array of the Hall elements 7 along the surface of the device to be measured DUT by an actuator to scan a two-dimensional space, which is the surface of the device to be measured DUT. Thus, since magnetic force lines can be sampled in a batch in the one-dimensional direction, the magnetic force lines can be measured at a high speed and a low cost.

Also, as shown in FIG. 11, since the magnetic force lines are sampled and detected in a batch in the two-dimensional space, which is the surface of the device to be measured DUT by the two-dimensional element array 43, no actuator or the like for the two-dimensional Hall array 43 is required, and thereby a higher-speed test device can be provided.

In the above embodiments, a semiconductor memory as a device having a periodic wiring structure and the test device therefor were described, but devices having a periodic wiring structure and the test devices therefor are not limited to them and the present invention may be applied to devices such as a CMOS image sensor, CCD sensor, liquid crystal panel and the like and the test devices therefor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A test device for testing a semiconductor device having a periodic wiring structure, comprising:

magnetic force line detecting means comprising the magnetic force line detecting means is a one-dimensional magnetic force line detecting element array in which a plurality of magnetic force line detecting elements, for detecting magnetic force lines generated from the semiconductor device, are arranged in one line, said magnetic force line detecting means sampling and detecting at multiple points and at predetermied intervals magnetic force lines in a periodic distribution pattern generated from the semiconductor device, said semiconductor device comprising,
   (a) a current source,
   (b) a current source connector for simultaneously connecting at one end each of said plurality of periodically disposed wiring lines to the current source, and
   (c) a ground connector for simultaneously connecting the other end of each of said plurality of periodically disposed wiring lines to ground, wherein said current source connector and said ground connector provide current paths for the current source and generate magnetic force lines in a periodic distribution pattern from currents flowing in said plurality of wiring lines;

moving means for moving the magnetic force line detecting means along the surface of the semiconductor device on which the wiring lines are provided wherein the moving means moves the one-dimensional magnetic force line detecting element array in the direction perpendicular to the direction of the array of the magnetic force line detecting elements along the surface of the semiconductor device on which the wiring lines are provided; and pattern judging means for judging the periodic distribution pattern of the magnetic force lines detected by the magnetic force line detecting means.

2. The test device for testing a semiconductor device having a periodic wiring structure according to claim 1, wherein the current source has a constant current function for keeping the currents flowing in each wiring line generally constant.

3. The test device according to claim 1, wherein the pattern judging means obtains a spatial frequency spectrum of the periodic distribution pattern of the magnetic force lines detected by the magnetic force line detecting means by Fourier transform and collates an obtained frequency spectrum with a spatial frequency spectrum of a reference distribution pattern.

4. A test device for testing a semiconductor device having a periodic wiring structure, comprising:

a two-dimensional magnetic force line detecting element array in which a plurality of magnetic force line detecting elements for detecting magnetic force lines in a periodic distribution pattern generated from the semiconductor device, said semiconducto device comprising
   (a) a current source,
   (b) a current source connector for simultaneously connecting at one end each of said plurality of periodically disposed wiring lines to the current source , and
   (c) a ground connector for simultaneously connecting the other and of each of said plurality of periodically disposed wiring lines to ground, wherein said current source connector and said ground connector provide current paths for the current source and generate magnetic force lines in a periodic distribution pattern from currents flowing In said plurality of wiring lines; and pattern judging means for judging the periodic distribution pattern of magnetic force lines detected by the two-dimensional magnetic force line detecting element array.

5. The test device according to claim 4, wherein the pattern judging means obtains a spatial frequency spectrum of the periodic distribution pattern of the magnetic force lines detected by the magnetic force line detecting means by Fourier transform and collates an obtained frequency spectrum with a spatial frequency spectrum of a reference distribution pattern.

6. The test device for testing a semiconductor device having a periodic wiring structure according to claim 4, wherein the current source has a constant current function for keeping the currents flowing in each wiring line generally constant.

7. The test device according to claim 4, wherein the pattern judging means obtains a spatial frequency spectrum of the periodic distribution pattern of the magnetic force lines detected by the magnetic force line detecting means by Fourier transform and collates an obtained frequency spectrum with a spatial frequency spectrum of a reference distribution pattern.

* * * * *